United States Patent [19]
Davies

[11] Patent Number: 5,778,095
[45] Date of Patent: Jul. 7, 1998

[54] CLASSIFICATION OF SCANNED SYMBOLS INTO EQUIVALENCE CLASSES

[75] Inventor: Daniel Davies, Palo Alto, Calif.

[73] Assignee: Xerox Corporation, Stamford, Conn.

[21] Appl. No.: 575,305

[22] Filed: Dec. 20, 1995

[51] Int. Cl.$^6$ .............................. G06K 9/62; G06K 9/68; G06K 9/70; G06K 9/46

[52] U.S. Cl. .................... 382/225; 382/190; 382/226; 382/227; 382/245

[58] Field of Search .................................. 382/181, 182, 382/224, 225, 226, 227, 228, 229, 190, 235, 245; 395/601, 606, 614; 707/1

[56] References Cited

U.S. PATENT DOCUMENTS

| | | | |
|---|---|---|---|
| 4,499,596 | 2/1985 | Casey et al. | 382/226 |
| 4,799,270 | 1/1989 | Kim et al. | 382/226 |
| 4,864,628 | 9/1989 | Scott | 382/21 |
| 4,977,603 | 12/1990 | Irie et al. | 382/34 |
| 5,075,896 | 12/1991 | Wilcox et al. | 382/225 |
| 5,263,097 | 11/1993 | Katz et al. | 382/225 |
| 5,303,313 | 4/1994 | Mark et al. | 382/56 |
| 5,317,649 | 5/1994 | Nishida | 382/224 |
| 5,359,671 | 10/1994 | Rao | 382/225 |
| 5,390,259 | 2/1995 | Withgott et al. | 382/224 |
| 5,479,523 | 12/1995 | Gaborski et al. | 382/224 |

OTHER PUBLICATIONS

Huttenlocher, D.P., Klanderman, G.A., and Rucklidge, W.J., "Comparing Images Using the Hausdorf Distance," *Research Report for Department of Computer Science*, Cornell University, Ithaca, N.Y., 1991.

Huttenlocher, D.P., Rucklidge, W.J., "A Multi–Resolution Technique for Comparing Images Using the Hausdorff Distance," *Research Report for Department of Computer Science*, Cornell University, Ithaca, N.Y., 1992.

*Primary Examiner*—Bipin Shalwala
*Attorney, Agent, or Firm*—Richard B. Domingo

[57] ABSTRACT

A method and apparatus for classification of scanned symbol into equivalence classes as may be used for image data compression. The present invention performs run-length symbol extraction and classifies symbols based on both horizontal and vertical run length information. An equivalence class is represented by an exemplar. Feature-based classification criteria for matching an exemplar is defined by a corresponding exemplar template. The feature-based classification criteria all use quantities that can be readily computed from the run endpoints. Reducing the number of equivalence classes is achieved through a process called equivalence class consolidation. Equivalence class consolidation utilizes the symbol classifier to identify matched exemplars indicating equivalence classes which may be merged. For a consolidated equivalence class, the exemplar matching the most symbols is selected as the representative for the class.

25 Claims, 9 Drawing Sheets

CLASSIFICATION OF SCANNED SYMBOLS INTO EQUIVALENCE CLASSES

CROSS REFERENCE TO RELATED APPLICATIONS

The present invention is directly related to an invention that is the subject matter of a concurrently filed, commonly assigned U.S. patent application Ser. No. 08/575,313, entitled "Consolidation of Equivalence Classes Of Scanned Symbols", herein incorporated by reference.

FIELD OF THE INVENTION

The present invention is related to the field of compression of scanned images of text.

BACKGROUND OF THE INVENTION

A major stumbling block to common use of digitized images is their size. An 8.5×11 image at 300 dots per inch (dpi) contains roughly 8,000,000 pixels. Even after binarization of a scanned image reduces the number of bits per pixel to 1, this is still 1 megabyte. Compression techniques are typically characterized as LOSSLESS or LOSSY. In LOSSLESS compression, no data is lost in the compression and subsequent decompression. In LOSSY, a certain amount of data is lost but it is acceptable since the essence of the compressed data is retained after decompression. Common LOSSLESS compression techniques for binary images, like CCITT Group 3 or Group 4 can compress a binary image by factors of 10 to 20. This is still large when compared to the synthetic electronic form used to create a comparable image.

Most documents contain text. One way to compress text on a binary image is to perform Optical Character Recognition to create a text stream, compress the text stream using some text compression scheme and store the results. Unfortunately, the mistakes made in selection of character, font, face and position are often objectionable.

Another method is to group the symbols found into equivalence classes. In this method, symbols are extracted from the binary image and matched to templates for one or more equivalence classes. Classification is based partially on symbol features, like width, height and mass (number of black pixels). Typically, the templates are "bit-maps" of the symbol representing the equivalence class. The primary classification criteria are based on the position, arrangement and number of error pixels. The error pixels are defined as pixels which are "on" in either the extracted symbol or template, but not both. The compressed output file contains the position of each symbol, the ID of a class exemplar used to represent the class and one representation of each class exemplar (the template).

When performed successfully, this method avoids the overhead of encoding every symbol individually as is done in standard LOSSLESS compression. It also avoids many of the problems associated with attempting to find a font and face that adequately represent the appearance and spacing of characters that have been degraded by being printed (with an unknown font), faxed, copied and scared. In particular, it works for non-roman character sets, broken and joined characters, graphics and whatever else appears on the page. Prior schemes perform classification by comparing symbol bitmaps with exemplar bitmaps.

Accordingly, the heart of such a system is the symbol classifier. In order to get good compression, a classifier should produce a small number of classes. In order to avoid symbol substitution errors, it should create a new class each time it's not really sure that a new symbol matches any of the existing templates. This tends to create a large number of classes. The objective is to have the classifier measure exactly the metrics used by a human familiar with the character set of the text in the binary image. However, known classifiers measure symbol properties that are not well correlated with these metrics. This results in symbol substitution, excessive numbers of equivalence classes, or both.

An example of image compression based on symbol matching is described in U.S. Pat. No. 5,303,313 entitled "Method and Apparatus For Compression Of Images", Mark et al., issued Apr. 12, 1994 (the '313 patent). In the '313 patent an image is "precompressed" prior to symbol matching. The '313 patent describes using run-length encoding for such precompression. Symbols are extracted from the run-length representation. A voting scheme is used in conjunction with a plurality of similarity tests to improve symbol matching accuracy. The '313 patent further discloses a template composition scheme wherein the template may be modified based on symbol matches.

SUMMARY

A method and apparatus for classification of scanned symbols into equivalence classes is disclosed. The present invention performs run-length symbol extraction and classifies symbols based on both horizontal and vertical run length information. An equivalence class is represented by an exemplar. Feature-based classification criteria for matching an exemplar are defined by a corresponding exemplar template. The exemplar template is comprised of horizontal and vertical template groups each defining criteria for matching one or more symbol runs. The feature-based classification criteria all use quantities that can be readily computed from the run endpoints.

The method for symbol classification of the present invention is generally comprised of the steps of: extract symbol, prepare extracted symbol for alignment, identify equivalence classes for comparison, generate symbol features from run information, obtaining exemplar template from one of the identified equivalence classes, checking that symbol meets exemplar size and slant thresholds, if extracted symbol is small performing small symbol checks, aligning extracted symbol or exemplar template if necessary, find symbol runs satisfying exemplar template group criteria, if all template group criteria satisfied and all symbol runs consumed, there is a match so record position of symbol and identifier for matching exemplar. This is repeated for each equivalence class identified for comparison until there is a match. If there is no match, a new equivalence class is created with the extracted symbol as the exemplar. The small symbol checks are generally comprised of comparing symbol features, that have been determined to be particularly relevant to small symbols, to equivalence class exemplar thresholds.

Reducing the number of equivalence classes is achieved through a process termed equivalence class consolidation. In equivalence class consolidation exemplars are matched using the symbol classification process described above. Three versions of each exemplar are matched against other equivalence classes: the original exemplar, the exemplar shifted up by one pixel and exemplar shifted right by one pixel. This helps minimize the effects of misalignment or noise and facilitates finding the most possible matches. Selection of which exemplar is used to represent the consolidated equivalence class is made by determining which exemplar matches the most symbols.

The present invention is preferably implemented on a computer based system for compression of image data.

DETAILED DESCRIPTION OF THE EMBODIMENT

A method and apparatus for classification of scanned symbols into equivalence classes is disclosed. The present invention may be used in various applications such as Optical Character Recognition (OCR), data encryption or data compression. Such applications may be found as part of an overall image processing system or as stand-alone applications. The currently preferred embodiment of the present invention is implemented as software running on a computer based system. The software is written in the C programming language. The present invention has been preferably implemented for compression of image data. The following terms and their meanings are used in this description:

Image refers to the markings on or appearance of a medium.

Image data refers to a representation of an image which may be used for recreating the image.

An equivalence class is a set of symbols found in an image that can be substituted for one another without changing the appearance of an image in an objectionable way.

An exemplar of the equivalence class is the symbol that will be substituted for every member of the equivalence class when the image is decompressed or otherwise recreated.

An exemplar template or template is the set of data structures and criteria used to match a symbol to an exemplar.

An extracted symbol or symbol is an image representation of a marking on a medium obtained from image data.

The present invention is directed to an improved symbol classifier. The system of the currently preferred embodiment utilizes and maintains a list of equivalence classes (also referred to as a dictionary). Extracted symbols are compared to exemplars of the equivalence class to determine if it should be added to an existing equivalence class. If there is no match, a new equivalence class is created with the extracted symbol as the exemplar.

Figure 1:
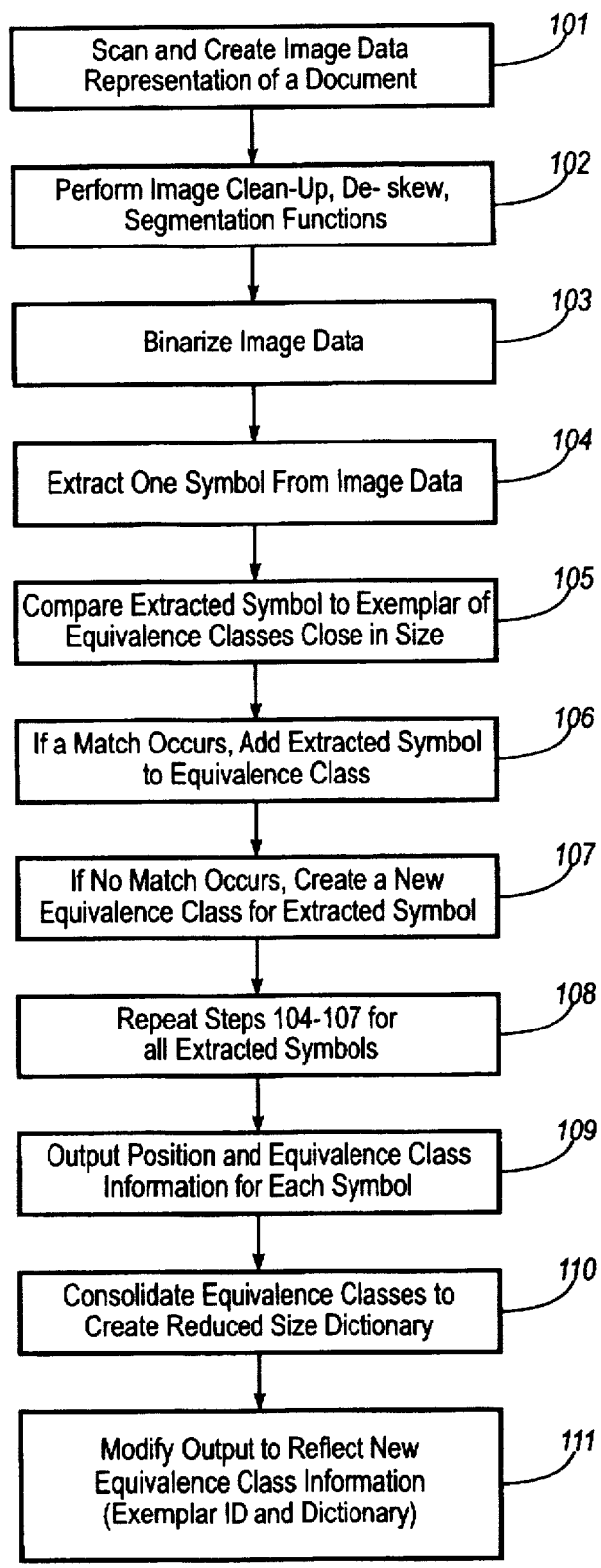
FIG. 1 is a flowchart of the steps for classifying scanned symbols into equivalence classes as may be performed in the currently preferred embodiment of the present invention.

As noted above, the present invention may be used in various applications. FIG. 1 is a flowchart which describes the general steps of an application utilizing the present invention. First, a document is scanned to create image data, step 101. Are image data is typically a bit-mapped representation of the image. Various operations may then be performed on the image data such as image clean-up or segmentation of text and image, step 102. It is the text portion that is processed by the present invention. The text portion of the image data is then converted into a binary representation, e.g. by some thresholding technique, to create a representation where each pixel is represented by a single bit, step 103. A "black" or "on" pixel is typically represented by a binary 1 value while a "white" or "off" pixel is represented as a binary 0. It is at this point where symbol matching begins.

First, a new individual symbol is extracted from the image data, step 104. In the currently preferred embodiment, this extraction will occur through a connected components analysis of the binary image. Symbols are represented as lists of horizontal runs. A run is defined as a sequence of "black" or "on" pixels. The extracted symbol is then compared to each exemplar of an equivalence class which is close in size to the extracted symbol, step 105. This step is termed symbol classification. If a match is found, the extracted symbol is added to the class of the matched exemplar, step 106. If the new symbol does not fit into any equivalence class, a new equivalence class is created, step 107. In the currently preferred embodiment, the shape of a symbol that is added to an existing class is immediately discarded, leaving only the exemplar to represent the class. The steps 104–107 are then repeated for all symbols in the image, step 108. When all the symbols are processed, information is output containing the position of each symbol along with an identification of the exemplar that should represent each symbol and some representation of the exemplar of each equivalence class, step 109. In other words, a set of position, exemplar identifier pairs followed by a dictionary containing the exemplars. Typically, this information will be much less than the binary representation of the image resulting in a compressed image. The equivalence classes may then be consolidated to create a smaller number of classes, step 110. If equivalence classes are consolidated, the exemplar identifiers and exemplar dictionary output in step 109 are modified to reflect the consolidation of the equivalence classes, step 111.

Data Compression/Decompression Embodiment

Scanned images containing machine-printed text can be compressed by grouping the symbols found into equivalence classes. The currently preferred embodiment has been implemented in a system for compressing image data. In this system, the symbol classifier is used to classify extracted symbols into equivalence classes which are represented by unique exemplars. The number of created equivalence classes will be less than the total number of symbols extracted. The created output stream is comprised of exemplar ID/position pairs followed by a dictionary comprised of the exemplars.

As described above, the present invention further provides for consolidation of the set of equivalence classes. Reducing the number of equivalence classes further compresses the image data by reducing the size of the dictionary. The manner in which consolidation occurs is nearly identical to the way in which symbols are compared to exemplars (this is described in greater detail below.) In general, the more work expended to match symbols (trying several offsets relative to each other, etc.), the more matches that will be found. For the sake of efficiency, this extra effort may be more efficiently expended on the relatively small set of classes rather than performing it on the entire set of raw symbols.

When the image is decompressed, each of the pairs is processed so that an instance of identified exemplar is placed at the specified location. This continues for all the pairs. As some data may be lost in the matching process, this type of compression is termed LOSSY compression. Despite the data lost, the essence of the image remains.

Symbol Classifier

As noted above, one object of the present invention is to provide an improved symbol classifier. The symbol classifier of the present invention does not analyze bit maps. Rather, the runs representing the symbol are used directly to classify the symbol. The classifier still uses symbol features like width and height for classification. For more detailed symbol features, the classifier compares the position of each symbol run endpoint with a corresponding range of legal endpoint locations computed by looking at corresponding groups of three adjacent scan lines in an exemplar.

To achieve sufficient accuracy, vertical runs are produced from the horizontal runs and both sets of runs are used in classification. Feature-based classification criteria all use quantities that can be readily computed from the run endpoints. Availability of these endpoints makes generation of numerical measures of the symbol much easier than it would be with bitmaps. The feature based classification criteria is described below followed by a description of how they are used by the symbol classifier.

INDIVIDUAL SYMBOL WIDTH AND HEIGHT

Symbol width and height are specified by a bounding box surrounding the symbol. These are used to select a subset of the equivalence classes to compare against and to decide which symbol feature tests to apply. In the currently preferred embodiment, the equivalence class exemplar must be within the range of plus or minus two pixels of the symbol width and height in order to be eligible for comparison.

The most basic tests are adequate for distinguishing large symbols. On smaller symbols, subtle features become important so more tests are needed. Small symbols are generally defined as those having a width or height of 20 or fewer pixels.

EQUIVALENCE CLASS WIDTH AND HEIGHT

This is used in two ways. First, very small symbols have a smaller range of matching widths and heights. Therefore, a minimum and maximum allowable is width and height are recorded with each class. Symbols outside this range cannot be included in the class.

The other use of the width and height ranges occurs during equivalence class consolidation. Again, it provides a minimum and maximum allowable width and height, but in this case the ranges change as classes are consolidated. Equivalence class consolidation is described in greater detail below.

Mass

The mass of a symbol is the number of black pixels it contains. Checking mass is one of the small symbol checks. It is used primarily to distinguish bold and normal face characters. The two symbols do not match if the ratio of their masses is too large. Since division is a time-consuming operation, the criterion of the currently preferred embodiment is based on the difference between the masses. The current calculation for amount of difference allowed is (symbolArea * (1+symbolArea/256))/8. Other calculations may be utilized Such as one based primarily on the symbol's mass or on a function of both mass and area. Note that the division operator shown in the formula is integer division where all fraction bits are intentionally lost.

Interior

Checking interior is one of the small symbol checks. It is difficult, but important, to distinguish very small punctuation symbols. Little round blobs of connected black pixels match almost anything. A great many symbols fit within an envelope of plus or minus one pixel from a round blob. However, a round blob has a significantly different number of interior pixels than a comma does. The number of interior pixels is defined as the mass minus twice the number of horizontal runs (which can roughly determined by the number of black pixels minus the number of horizontal edge pixels). This is not exact, but is close enough and is easy to compute. Two symbols fail to match if their interiors differ by more than the mass difference range specified above.

Slant

Small, round, italic characters are difficult to distinguish from small, round, non-italic characters, i.e. "o" vs. "o". All the pixels in one are very close to pixels in the other. Slant is computed as a measure of how tilted a symbol is. One cannot use a symbol's slant to say "this symbol is an italic character," since some characters, like "y" are naturally slanted. One can use slant to compare two characters, saying that they do not match if the difference between their slants is too large.

Slant is computed as a function of the number and expanse of corners on a symbol. Every time the difference between the x position of run endpoints on consecutive rows is +1 or −1, that difference is added to the slant. If it is greater than +1 or less than −1, +2 or −2 is added as appropriate. This is also done for vertical runs to highlight slant. Two symbols do not match if their slants differ by more than MIN(width, height)/2.

Horizontal and Vertical Volumes

Small, dense, squarish things, like "B" and "a" are often difficult to distinguish from small, dense, roundish things like "8" and "e". The holes in these characters vary in size quite a bit. It is safest to compute a measure based solely on the exterior of the symbols. In order for these mismatched symbols to pass the mass and interior tests, the round ones tend to be either taller or wider, or both.

Horizontal and vertical volumes are defined similarly. The horizontal volume is defined as the number of pixels between the far left and far right endpoints in rows whose total extent is at least ⅞ of the width of the symbol. Likewise, the vertical volume is defined as the number of pixels between the top and bottom endpoints of columns whose total extent is at least ⅞ of the height of the symbol. This favors square things over round things. However, since the horizontal and vertical volumes are now often not meaningful, two flags, checkHVolumne and checkVVoluLme are provided. A flag is set if the corresponding volume is at least ¾ of the total area. Two symbols fail to match if either of their checkHVoluLme flags are set, their widths are not equal and the wider symbol has a smaller horizontal volume (i.e. is too round). Corresponding tests are applied to vertical volume. Checking horizontal and vertical volumes is also one of the small symbol checks.

Various processing steps performed by the symbol classifier are now described.

Symbol Alignment

Symbol alignment is used to prepare for matching the runs of a symbol against the run template groups of an exemplar. Two actions are taken. The first attempts to ameliorate the effects of misalignment along the run axis. The second attempts to align symbol and template runs.

When two symbols are misaligned along the run axis, any noise can cause a miscompare if care is not taken. To help with this problem, the endpoint coordinates are changed and expressed with an extra bit of significance. This changing of representing the symbol coordinates helps minimize the effect of dimensional changes caused by noise. The horizontal run endpoints as recorded range from—(realWidth-1) to (realWidth-1). This gives a computed width of (realWidth-1-(-(realWidth-1))=2*realWidth. The vertical run endpoints range from—(realHeight-1) at the top to (realHeight-1) at the bottom.

The most common reason for two symbols to be misaligned is that one has noise on one side that the other doesn't. This makes one of the symbols wider (or taller) by one pixel. However, this causes the recorded coordinates of corresponding runs to change by only 1. For all but the smallest symbols in the currently preferred embodiment a distance of 3 between symbol and exemplar endpoints is allowed. Three is the sum of 1 for misalignment plus 2 for being off by 1 pixel. That measure attempts to allow for misalignment along the axis of each run.

The second action taken attempts to align runs in the axis perpendicular to the runs. The system of processing a symbol's runs is described in detail below.

Briefly, each exemplar has a template that describes legal ranges for the endpoints of a matching symbol. Without an alignment step, comparison would always be between the bottom row of a symbol with the templates for the bottom exemplar row and so on. If the symbol has noise on its bottom that the exemplar does not have, the symbol and exemplar will not be correctly aligned. This can lead to a miscompare. Even worse, it can lead to symbols which are actually different being misaligned in such a way that their envelopes are just barely close enough. For example, if a capital letter "T" is misaligned slightly to the left of a numeral "1", the right side of the letter "T"s upper cap may not extend far enough to be seen as being significantly different than the numeral "1".

To avoid this, the locations of the horizontal and vertical central axes of the symbol are computed. The location of the vertical axis is found by averaging the points found on the left and right sides of the symbol's envelope (i.e. boundary). The horizontal axis is found by averaging the endpoints on the top and bottom of the symbol's envelope. This calculation is done with a couple of extra bits of precision (i.e. the result has two bits below the binary point). The distance from the horizontal axis to the bottom line of the symbol (and vertical axis to left side of the symbol) is then computed.

Before comparing a new symbol to any exemplar, an extra bottom row and left column for the symbol are created. These added row and column are termed an alignment row and an alignment column, respectively. The extra row (column) has one black pixel in the same column as the middle of each run in the real bottom (left) row (column). Similarly, alignment row and columns are added to the template data structures used to check symbol runs. With respect to the template alignment row and columns, they are in the form of a set of duplicate template groups which are used to check the bottom row and left column, respectively. Template groups are described in greater detail below. Before starting to compare the horizontal runs of a particular symbol with a particular exemplar, the differences in distances between horizontal axis and bottom row (vertical axis and left column for vertical runs) is examined. If the symbol's horizontal axis is at least one row closer to its bottom row than the exemplar's horizontal axis is to its bottom row, comparison is started by using the symbol's alignment row. If the exemplar's horizontal axis is more than one row closer to its bottom, comparison is started with the duplicate set of exemplar templates. This aligns the symbol runs with the exemplar templates.

Adding a row or column with a black pixel in the middle of a run is akin to adding noise. At the top and bottom of symbols, the checking is only for noise. Checking for noise is a check to see if symbol pixels are too far away for the exemplar. Since there is only one pixel in the middle of each run in the alignment row (column), it is unlikely that these pixels will be too far away from anything on the exemplar so as to cause a mismatch.

Using this technique both reduced errors and a noticeable reduction in the number of equivalence classes have been observed.

Comparing Symbol Run Endpoints to Exemplar Templates

This is the primary method of comparing symbols to equivalence class exemplars. For large symbols, this is all that is needed. It is not really appropriate for catching very small differences in very small symbols (the small symbol checks catch these differences). If the template ranges are tightened down enough to catch those, far too many classes may be produced.

Exactly the same techniques (and software code) are used to match horizontal symbol runs against horizontal exemplar templates as is used to match vertical symbol runs against vertical exemplar templates. The horizontal run checks are used to detect mismatches on vertical edges. The vertical run checks are used to detect mismatches on horizontal edges. Both type of checks are performed to make sure exact checks are performed on all the edges. For the sake of brevity, only checking of horizontal templates and horizontal runs is described. The checking of vertical templates and vertical runs is identical.

The simplest way to compare an exemplar to a symbol would be to compare each exemplar run to one symbol run. Unfortunately, it has been determined that this does not allow for enough variation between exemplar and symbol. Instead of looking at a single exemplar run for each symbol run, a thin, three row horizontal slice of the exemplar is used to compute the endpoint templates for each symbol run. For every row n in the exemplar, a horizontal slice of the exemplar containing rows n−1, n, and n+1 is extracted. Each connected component in this slice corresponds to one group. A connected component can be readily identified by the set of runs which overlap a run in an adjacent row in the slice. A group is the data structure that holds the templates used to check the endpoints of symbol runs.

Figure 2:
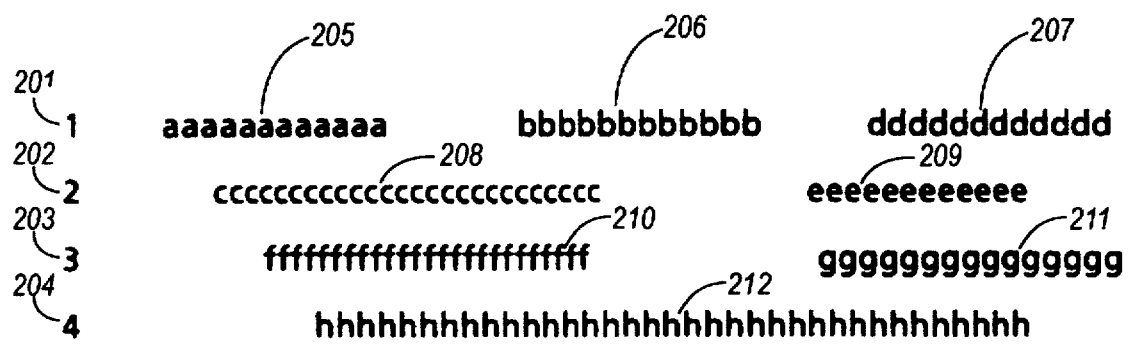
FIG. 2 is an illustration of groups of runs which are formed from thin horizontal slices of an exemplar.

This notion of groups is illustrated in FIG. 2. Referring to FIG. 2, line 1 201 contains runs "a" 205, "b" 206 and "d" 207, line 2 202 contains runs "c" 208 and "e" 209, line 3 203 contains runs "f" 210 and "g" 211 and line 4 204 has run "h" 212. So for the slice defined by line 1 201, line 2 202 and line 3 203 there are two groups. The first group is defined by runs "a" 205, "b" 206, "c" 208 and "f" 210. The second group is defined by runs "d" 207, "e" 209, and "g" 211. For the slice defined by line 2 202, line 3 203 and line 4 204 there is only one (group. This group is defined by the runs "c" 208, "e" 209, "f" 210 , "g" 211 and "h" 212.

A benefit of this grouping is that it enables tolerance of uncertainty in the placement of edges. For example, the present invention shall tolerate the edge represented by run "h" 212 moving up one line, joining runs "f" 210 and "g" 211. Thus grouping allows horizontal groups to tolerate vertical noise and vertical groups to tolerate horizontal noise. As another example, the left and right sides of a 10×10 circle with thin walls are connected in the image, but would have individual groups since a 3-row slice through the middle of the circle would contain two distinct connected components. A 3-row slice at the t o p would have one connected component, hence one group. However, all 3-row horizontal slices around a hole that's less than 3 rows tall (or 3 columns wide) will see a single connected component, hence will produce one group.

Each template group is of a specific type. There are four types of template groups. The type of a group determines what kind of checking is done. If any check fails, the symbol and exemplar do not match except as noted. The four group types are:

CheckNoise

This type is used at the edges of exemplars. The last line of exemplar pixels might or might not exist in a matching symbol. Similarly, the vacant space to immediately adjacent to the edge of the exemplar might have bits from a matching symbol in it. The purpose of a CheckNoise group is to guarantee that if a symbol run intersects the range covered by the CheckNoise group, the entire symbol run is contained in that range. There is a parameter specifying the minimum length of an exemplar edge that qualifies for its own CheckNoise group. In addition, only symbol runs to the right of a given point are checked so that this group may be used later with the Check1RunNoAdvance criteria (described below).

Check1Run

This is the most common group. It is used when the exemplar has exactly one run on each of the three scan lines in the area of interest. It contains a range of left and right endpoint values. The left endpoint range extends between the leftmost left endpoint of the three runs and the rightmost left endpoint of the three lines. Then some slop is added. The size of the slop on the left is a function of both the symbol size and whether the leftmost point belonged to the middle exemplar line (allow more slop relative to middle lines). The right endpoint range is computed in the same way.

Sometimes, the symbol may have two runs on the middle scan line. This happens when the instance of a symbol used to make the exemplar has a closed (filled in) loop but other instances do not. Since the classification is primarily concerned with the shape of the symbol's envelope, this difference should not cause a miscompare. Therefore, if the criteria above fails, the CheckEndpoints tests are performed.

CheckEndpoints

This test is used when there is more than one run on any of the three rows of a group. What is checked for is that the far left end and far right end of the blocks of runs contained in the range are in the right places. This is consistent with the philosophy that the presence or absence of small holes is not important. It also allows forks and joins in the exemplar to move up or down a line. The far left and right endpoint ranges are determined in the same way as is done in Check1Run.

Check1RunNoAdvance

This group type deals with a special case. It is the same as a Check1Run group except that it does not advance beyond the current symbol run. This special case is illustrated below.

A vertical stroke is defined as a collection of vertically adjacent horizontal runs. There are horizontal strokes as well, but they are not considered for purposes of this illustration. Each row of a stroke contains exactly one run. In the loops of very small symbols, two vertical strokes might be connected on the top or bottom by a stroke containing only 1 run. The exact position of the run isn't nearly as important as the fact that it really does bridge the gap between the strokes. In this case, a CheckNoise group is issued to discard any noise to the right of the gap, a Check1RunNoAdvance group is used to check to see if there's a run covering the gap and another CheckNoise group to discard any runs to the right of the right end of the line above/below the gap. Thus noise blips are checked for and tolerated to the right and/or left of the gap, and the CheckNoise group checks for a single run that just covers the gap or a single run that covers all the space next to the lines above/below the gap.

As will be described in more detail below, a set of template groups of the types described above are generated and are subsequently used for comparing the exemplar to the symbol. The set of template groups define a set of matching criteria which must be satisfied if a match is to occur. This matching criteria may be unique to the equivalence class and its exemplar. During comparison, both template groups and symbol runs are processed from right to left, bottom to top. Each template group is used to check one or more symbol runs since a template group can be defined to be of multiple types. An extra set of groups is generated above the top of the exemplar to catch any noise on top of the symbol. If all the exemplar groups are checked without a failure, the number of remaining symbol runs is checked. If there are any symbol runs left, the symbol and exemplar do not match. If both horizontal and vertical sets of runs match, the symbol and exemplar match.

Comparison of Exemplar Groups Against Symbol Runs For Small, Round Dense Symbols The above checks are sometimes not enough. The particular problems noted are small, bold, "e" and small, bold "a". These both tend to turn into closed, roundish things. Humans deal with this by attaching greater significance to smaller features. When comparing small, dense, round things, another, more sensitive test is used. It is intended to determine not only whether the endpoints of the symbol lie within the ranges specified by the exemplar, but also whether the symbol endpoints move around inside the range in an way that indicates the symbols really aren't the same. For example, an "a" is a little more square than an "e" and has a little dent on the left. The left edge of the "a" is both to the left of the left edge of the "e" (at the bottom) and to the right of the left edge of the "e" (in the middle). However, uncorrelated noise in the symbol and exemplar could also cause the symbol and exemplar to appear to waiver with respect to each other.

Separate calculations for the left and right sides of a symbol are performed (or top and bottom when looking at vertical runs). The calculations for both sides is similar, so only the left side calculation is described. On each row, the distance between the leftmost endpoints of the symbol (column labeled S) and exemplar (column labeled E) is determined (column labeled EΔ). It should be noted that the endpoints of Symbol S and Exemplar E will always be a multiple of 2 due to the alignment process described above. The difference between these distances is computed on adjacent lines (column labeled EΔ–PΔ). This is like the first derivative. A variable, P, is maintained holding the previous non-zero difference (i.e. instance of EΔ–PΔ). This variable is initialized to 0 at beginning of the comparison process. Each time this difference in distances is non-zero (i.e. of EΔ–PΔ), the absolute value of (P+this difference) is added to a running sum of differences, then P is replaced with the new difference. If either the right side total or left side total is greater than ¾ of the height (¾ of the width when comparing vertical runs), the symbol and exemplar do not match.

symbol endpoint and exemplar endpoint move an equal amount. P gets its value from row 5. There is no change to the sum since EΔ–PΔ is zero.

In row 7, the exemplar endpoint moves. This results in a negative EΔ of –1. P retains the value from row 5. The value EΔ–PΔ=–1–1=–2 and the value added to the sum is the absolute value of (EΔ–PΔ)+P=–2–2=–4=4 which is added to the sum. The sum then takes on the value of 8.

In row 8, the exemplar endpoint again moves. This results in a negative offset EΔ of –3. The value P is from row 7. The value EΔ–PΔ=–3–1=–4 and the value added to the sum is the absolute value of (EΔ–PΔ)+P=–4–2=–6=6. The sum then takes on the value of 14.

This works because if two symbols are perfectly misaligned, the endpoint distances will all equal the same misalignment distance, so a difference is never recorded and will never add anything to the sum. Uncorrelated noise tends to cause the differences to look like +1,–1,+1,–1 and so on. The sum of each pair is 0, so the random variations are integrated out. On the other hand, real variations tend to go in the same direction for at least two steps, so they show up.

To implement this, the groups that are at the far left and right ends of the exemplar are tagged. When a tag is set, the

TABLE A

| Row No. | Symbol Endpoint (S) | Exemplar Endpoint (E) | Endpoint Δ (EΔ) | Current EΔ – Prior EΔ (EΔ – PΔ) | Last Non-Zero CΔ – PΔ (P) | Sum Updated | Sum ABS ((EΔ – PΔ) + P) |
|---|---|---|---|---|---|---|---|
| 1 | +2 | –1 | 3 | 3 | 0 | Yes | 3 |
| 2 | +2 | –1 | 3 | 0 | 3 | No | 3 |
| 3 | +2 | +1 | 1 | –2 | 3 | Yes | 4 |
| 4 | +2 | –1 | 3 | +2 | –2 | Yes | 4 |
| 5 | +2 | +1 | 1 | –2 | +2 | Yes | 4 |
| 6 | +4 | +3 | 1 | 0 | –2 | No | 4 |
| 7 | +4 | +5 | –1 | –2 | –2 | Yes | 8 |
| 8 | +4 | +7 | –3 | –4 | –2 | Yes | 14 |

An example of this calculation is described with reference to Table A. The various columns of Table A contain the information described above. The sum updated column of Table A indicates whether the sum value should be updated and is provided for description purposes. Recall that the sum is updated when the value EΔ–PΔ is non-zero.

Row 1 of Table A exemplifies the very first row analyzed. At the beginning of the processing the value of PΔ and P are initialized to zero. As EΔ–PΔ is non-zero and takes on the value 3, the sum will be changed. The result is that the Sum field takes on the value of 3.

In row 2, the symbol and exemplar endpoints did not move so EΔ–PΔ=0. Thus, there is no change to the sum. The value P is from row 1.

In row 3, the exemplar endpoint E has moved resulting in an EΔ value of 1. As the value EΔ–PΔ is non-zero (–2), a sum update is indicated. The value P is from row 1. So the Absolute value of (EΔ–PΔ)+P=–2+3 is 1, which is added to the sum to obtain the value of 4.

In row 4, the exemplar endpoint moves back to where it was in rows 1 and 2. As EΔ–PΔ is a non-zero value, a sum update is indicated. The value P is from row 3. However, as the absolute value of (EΔ–PΔ)+P or (–2+2) is zero, there is no effective change to the sum.

In row 5, the exemplar endpoint moves back to where it was in row 3. As EΔ–PΔ is a non-zero value, a sum update is indicated. The value P is from row 4. However, as the absolute value of (EΔ–PΔ)+P (i.e. –2+2) in this case is zero, there is no effective change to the sum. In row 6, both the difference between the exemplar run on the middle line of the group and the symbol run is computed. The flags are set only if the exemplar represents a small, round, dense symbol.

Classification Routine

The individual tests used in classification have been described. This section describes the order in which the tests are performed. As described above, a symbol extraction step finds all connected components, or symbols, in the image. For each symbol found, the symbol-finder calls a classification routine with the symbol's location, bounding box and a list of the runs comprising the symbol.

Figure 3:
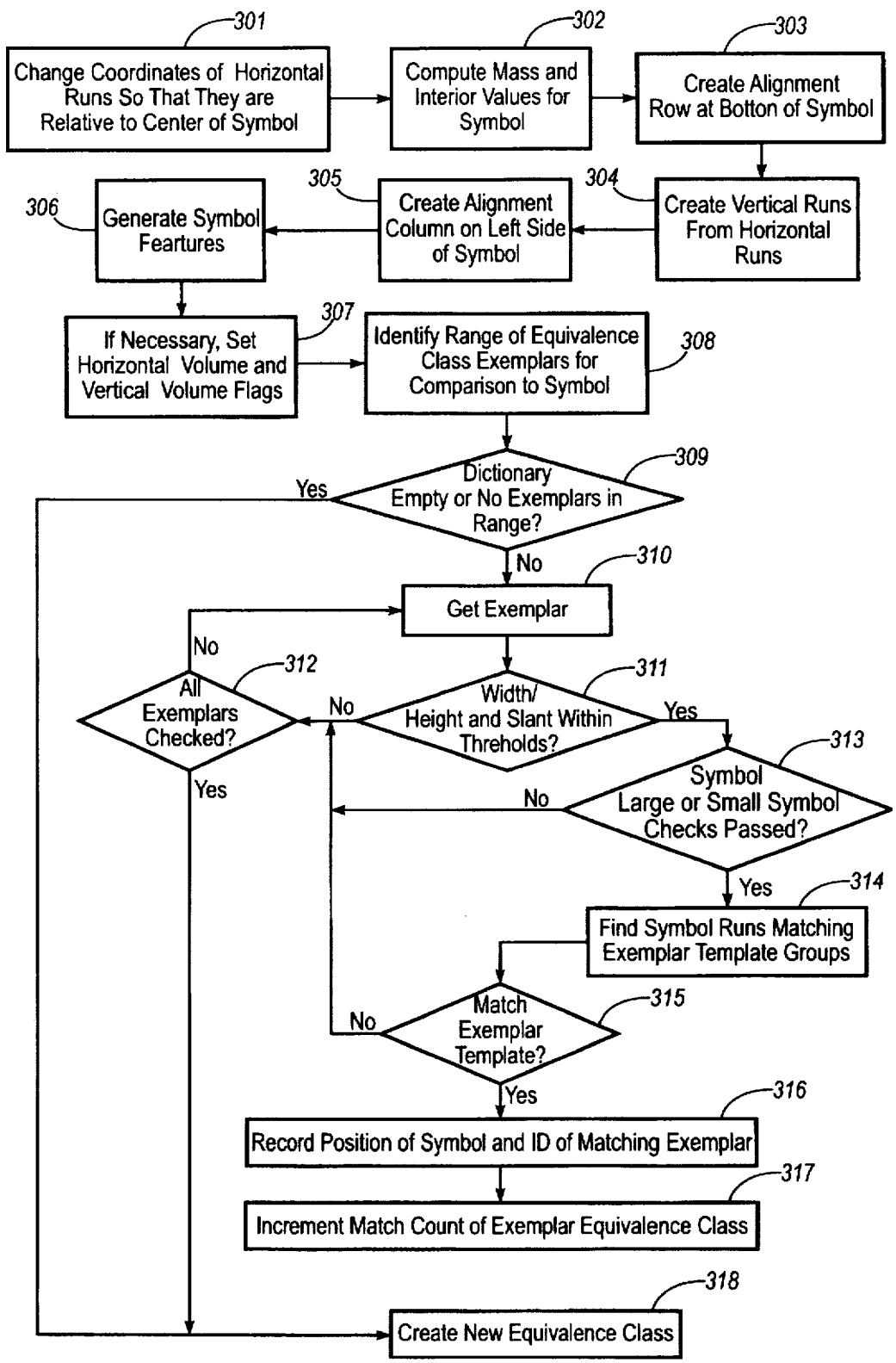
FIG. 3 is a flowchart outlining the steps of symbol classification as may be performed in the currently preferred embodiment of the present invention may be utilized.

FIG. 3 is a flowchart outlining the steps of the classification routine. First, the coordinates of the incoming horizontal runs are changed so that they 1) are relative to the center of the symbol, and 2) have offsets which are multiplied by 2, step 301. This creates symbol runs that range from –(width–1) to +(width–1) in steps of 2. Next, the symbol's mass and interior are computed, step 302. An alignment row is then created for the bottom of the symbol, step 303 This is done by computing a duplicate set of horizontal runs from the horizontal runs on the bottom scan line. These are the runs with a single black pixel in the middle column of each real horizontal run. As described above, the alignment row may be used to offset the symbol vertically (up) if necessary.

The symbol's vertical runs are computed from the horizontal runs, step 304. The vertical runs also use 2× coordinates centered on the middle of the symbol. An alignment column is then created, step 305. Here, a duplicate set of vertical runs from the vertical runs on the left column is created. These are the runs with a single black pixel in the middle row of each real vertical run. They will be used to offset the symbol to the right if necessary.

The features for the symbol are then computed, step 306. As described above, these features include slant, horizontal and vertical volumes, distance from horizontal central axis to symbol bottom and distance from vertical central axis to left column. Also, horizontal and vertical volumes are determined, and volume flags set if necessary, step 307. The flags are set if the corresponding volume is at least ¾ of the total area. These flags are aids in checking small, dense symbols.

The range of eligible exemplar templates from the dictionary are then identified for comparing to the symbol, step 308. As described above, the exemplar must have a height and width within two pixels of the extracted symbol in order for a comparison to be made. The exemplar templates are grouped by width and height. The Table B shows the sequence in which the exemplars are compared. The numbers given under the "w" and "h" columns are offsets from the symbol's width and height respectively. For example, the first group of exemplars have the same width and height as the symbol; the second group of exemplars searched is 1 wider than the symbol and so on. All exemplars of a given width and height group are examined before looking at the exemplars of the next size group in the sequence.

TABLE B

| Sequence # | w | h | Sequence # | w | h |
| --- | --- | --- | --- | --- | --- |
| 0 | 0 | 0 | 1 | +1 | 0 |
| 2 | −1 | 0 | 3 | 0 | −1 |
| 4 | 0 | +1 | 5 | −1 | −1 |
| 6 | +1 | −1 | 7 | −1 | +1 |
| 8 | +1 | +1 | 9 | −2 | 0 |
| 10 | +2 | 0 | 11 | 0 | −2 |
| 12 | 0 | +2 | 13 | −2 | −1 |
| 14 | +2 | −1 | 15 | −2 | +1 |
| 16 | +2 | +1 | 17 | −1 | −2 |
| 18 | −1 | +2 | 19 | +1 | −2 |
| 20 | +1 | +2 | 21 | −2 | −2 |
| 22 | +2 | −2 | 23 | −2 | +2 |
| 24 | +2 | +2 | | | |

If it is determined that the dictionary is empty, or there are no exemplars in range, step 309, then a new equivalence class is created, per step 318. Otherwise an exemplar is retrieved using the order described in Table A, step 310. The first check is to determine if the symbol width and height and the symbol slant features are within the exemplar thresholds, step 311. The exemplar defines minimum and maximum values for symbol height and width. The slant threshold is defined by the function MIN(width, height)/2. If these features are not within the exemplar thresholds, then a check is made if that was the last exemplar eligible to be compared to, step 312. If it is not, then a next exemplar is retrieved per step 310. If it is the last exemplar, then a new equivalence class is created per step 318. The step 318 of creating a new equivalence class is described below with reference to exemplar templates.

If the symbol width and height and slant features are within the exemplar thresholds, a test for small symbols (i.e. not large) and the small symbol checks are performed, step 313. The test for a small symbol is if either the height or width of the symbol is 20 pixels or less. This enables the special checking for small symbols to also be performed on narrow or flat symbols. The small symbol checks are described in greater detail with reference to FIG. 4 and are in addition to checks performed on larger symbols. If the symbol is small and any of the small symbol checks are not met, there is no match with this exemplar and processing continues at step 312 to try another exemplar if possible.

If the symbol is large or is small and all the small symbol checks have been passed, symbol runs matching template group criteria are found, step 314. As described above, the exemplar templates are comprised of horizontal and vertical template groups, each having particular match criteria. This process of using the template groups is described further with reference to FIG. 5. It is then determined if an exemplar template is matched, step 315. If no match occurs, processing continues per step 312 to try another exemplar if possible. If a match is made, the position of the symbol and the ID of the matching exemplar are recorded, step 316. Finally, a match counter for the exemplar template is incremented, step 317. As will be described below, the match counter is used during equivalence class consolidation to determine which exemplar is to be used to represent a consolidated equivalence class.

The steps described in FIG. 3 are repeated for each symbol extracted from the image.

Small Symbol Checks

Figure 4:
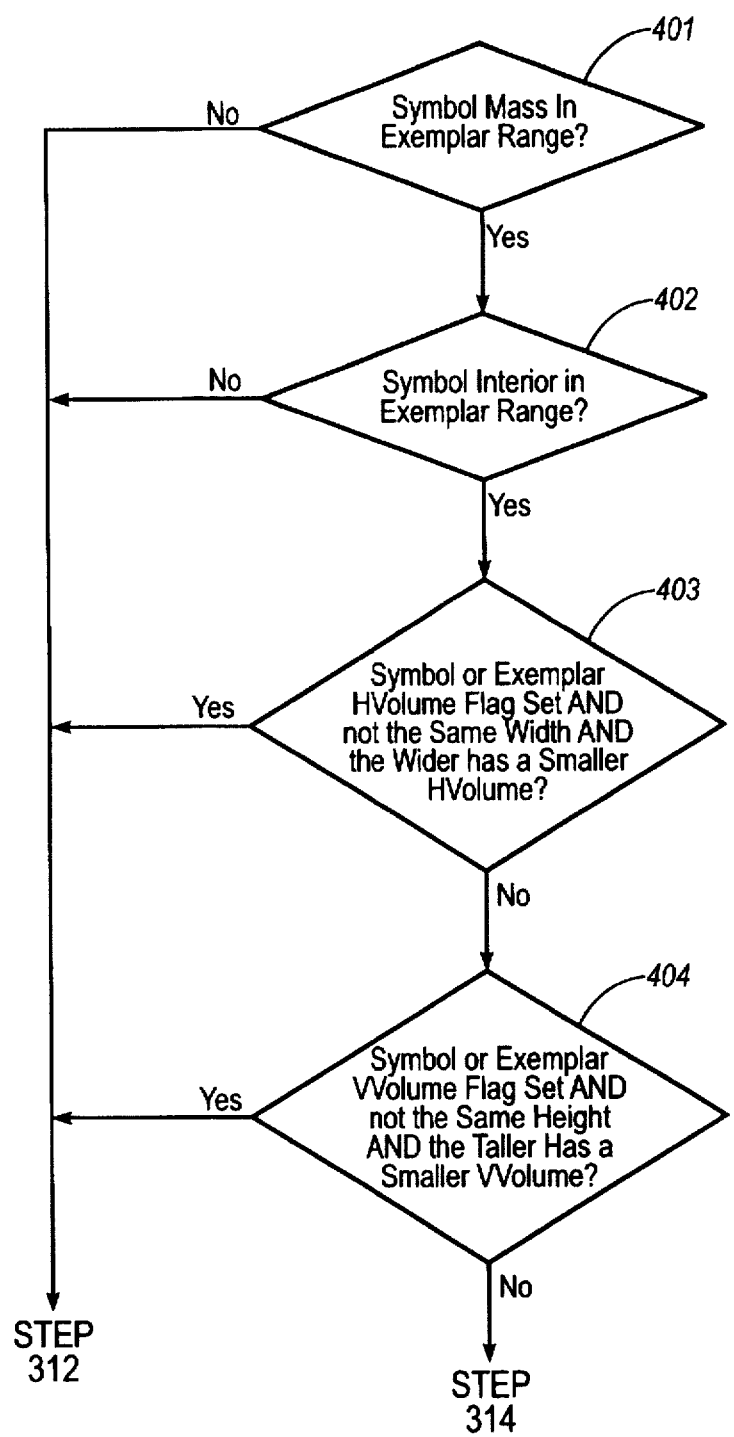
FIG. 4 is a flowchart outlining the steps for small symbol checks as may be performed in the currently preferred embodiment of the present invention.

FIGS. 4 is a flowchart illustrating the small symbol checks. These checks were referred to in Step 313 of FIG. 3. Generally, these checks compare symbol features with exemplar thresholds. However, it should be noted that further checks for small and dense symbols are performed with respect to the comparison of template groups and symbol runs described with reference to FIG. 5. Referring to FIG. 4, the following checks are performed on small symbols:

Is the symbol's mass within the range specified by the exemplar, step 401? The two symbols do not match if the ratio of their masses is too large. If too large, try the next exemplar per step 312 of FIG. 3. Otherwise perform next check.

Is the symbol's interior within the range specified by the exemplar, step 402? Two symbols fail to match if their interiors differ by more than the mass range. If interiors differ by more than the mass range, try the next exemplar per step 312 of FIG. 3.

The remaining checks are then used for small and dense symbols. The indication for density is the setting of the HVolume or VVolume flag.

Is the symbol's checkHVolume flag OR the exemplar's checkHVolume flag set AND the symbol and exemplar are not the same width AND the wider of the pair has a smaller HVolume, step 403. If yes, try the next exemplar per step 312 of FIG. 3. Otherwise perform next check.

Is the symbol's checkHVolume flag OR the exemplar's checkVVolume flag set AND the symbol and exemplar are not the same height AND the taller of the pair has a smaller VVolume?, step 404. If yes, try the next exemplar per step 312 of FIG. 3. Otherwise, all the small symbols checks are passed and the template group criteria analysis for the exemplar is performed per step 314 of FIG. 3.

Template Group/Symbol Run Matching

Figure 5:
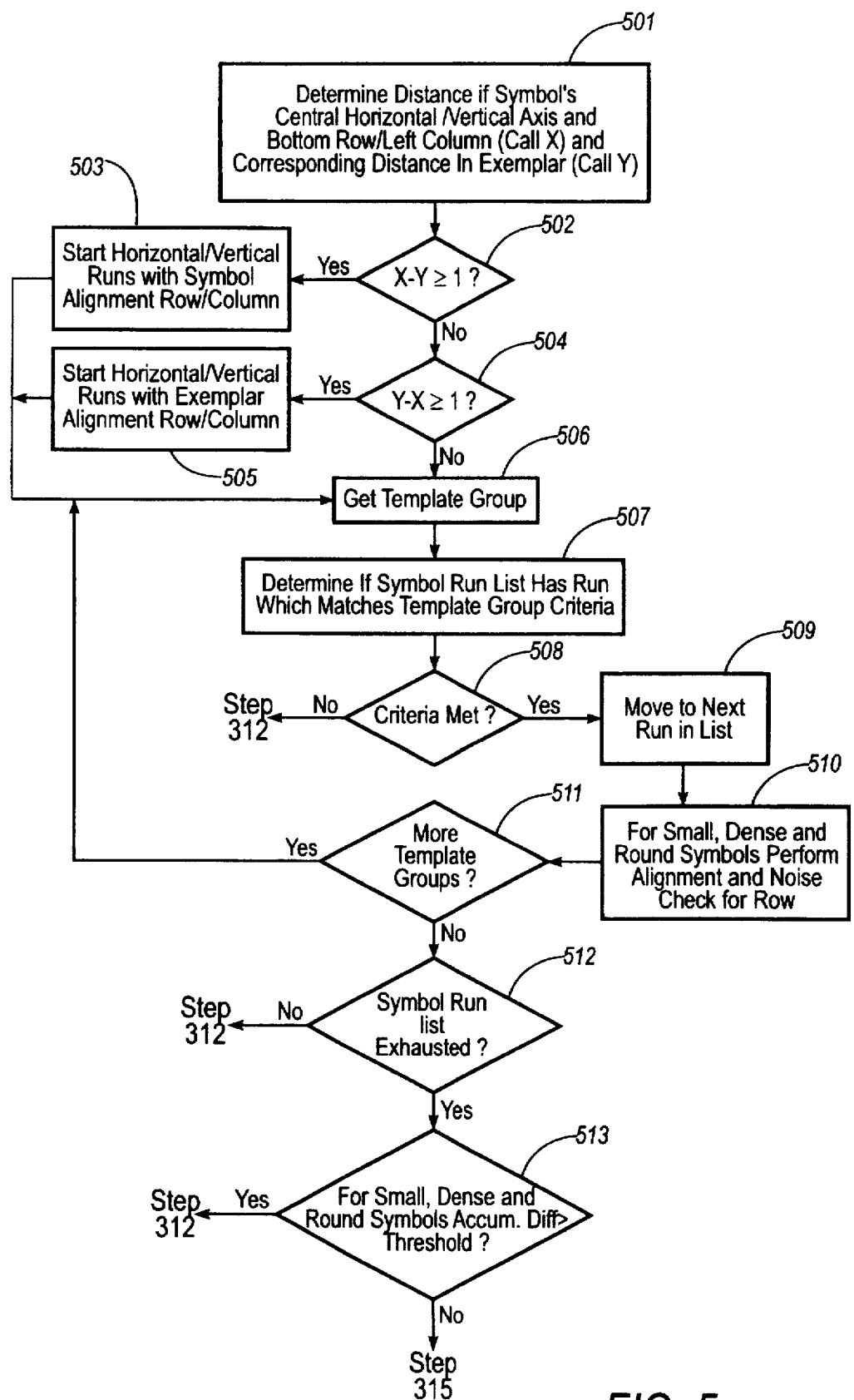
FIG. 5 is a flowchart outlining the steps for template group/symbol run comparison as may be performed in the currently preferred embodiment of the present invention.

The process of matching template groups with symbol runs is identical for both horizontal/vertical template groups and horizontal/vertical symbol runs. Accordingly, the steps described in the flowcharts of FIG. 5 apply to both horizontal and vertical runs. It should be noted that FIG. 5 also describes further steps for checking small, dense and round symbols. Referring to FIG. 5, the first step is to determine what the distance is between the symbol's horizontal/vertical axis and its bottom row/left column (called value X) and the corresponding distance in the exemplar (called value Y), step 501. These measurements are used to determine whether or not alignment rows/columns are added to the symbol or exemplar. If step 502, X-Y ≧ 1, is true, then an alignment row/column is added to the symbol, step 503. In other words with respect to the horizontal runs, if the symbol's axis is at least 1 row closer to its bottom row than the exemplar axis is to its bottom row, start with the symbol's alignment row to align symbol with exemplar. Conversely, if step 504, Y-X ≧ 1 is true, then an alignment row/column is added to the exemplar, step 505. In other words, if the exemplar's axis is at least 1 row closer to its bottom row than the symbol's axis is to its bottom row, start with the alignment row of the exemplar. Note that this corresponds to a duplicated set of the template groups used for matching the bottom row of the symbol to the exemplar.

The processing proceeds with templates and symbol runs starting at the bottom row, right column of each exemplar. A template group is obtained, step 506. It is then determined if the current run(s) in the symbol run list matches the template group criteria, step 507. As described above, more than one run can be required to match the criteria for a template group, and the match criteria is specified by the group type. If the template criteria is not met by a run in the run list, the processing continues per step 312 of FIG. 3 to get a next exemplar. If the criteria is met, step 508, the runs matching the template group are consumed and the next run in the run list becomes the current run, step 509. This is to make sure that all runs match some template of the exemplar. If the symbol is small, round and dense, alignment and noise checks are performed for the row, step 510. This check is the accumulation of differences in adjacent row offsets when the current row has a non-zero adjacent row offset, that is described above with reference to Table A.

It is then determined if more template groups need to be checked, step 511. If yes, processing continues at step 506. If not, it is determined if the symbol run list has been exhausted, step 512. If not, no match has occurred and the processing continues per step 312 of FIG. 3 to get a next exemplar. For small, round and dense symbols, if the run list has been has been exhausted, it is determined if the accumulated offset difference is greater than a predetermined threshold, step 513. In the currently preferred embodiment, the predetermined threshold is ¾ of the height (¾ of the width when comparing vertical runs). If is not a small, round and dense symbol or the predetermined threshold is not exceeded, a match has occurred and processing continues per step 316 of FIG. 3 to code the symbol. If it is exceeded, the processing continues per step 312 of FIG. 3 to get a next exemplar.

Exemplar Templates

During the process of extracting and matching symbols, a symbol might not match any exemplar. In this case, a new equivalence class is created. The exemplar of the new class is the extracted symbol. When a new equivalence class is created, the template required to match a symbol to the flew exemplar is built. Fortunately, many of the symbol features that are used in the templates were created during the classification process and need not be re-computed. The new exemplar is then inserted into the list(s) of exemplars (i.e. dictionary) for subsequent symbol classification. For ease of searching, the exemplars are indexed by the size of a bounding box defining the exemplar.

Figure 6:
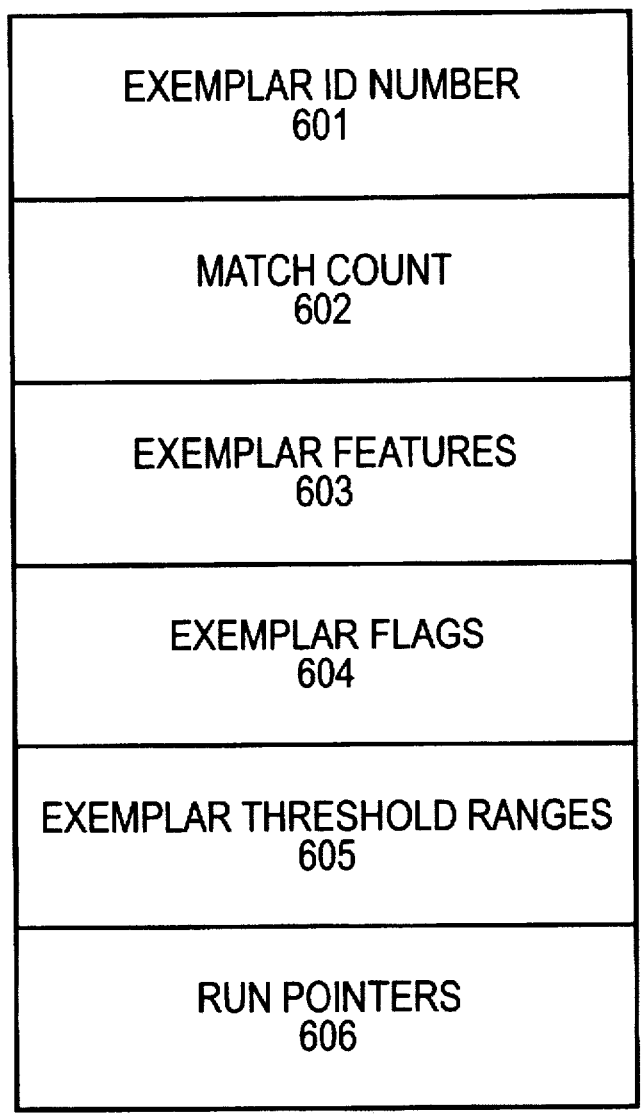
FIG. 6 is a block diagram illustrating the components of an exemplar template.

An exemplar template contains all the data needed to match a symbol to the exemplar. FIG. 6 illustrates the basic components of an exemplar template. Referring to FIG. 6, the exemplar template is comprised of: an exemplar ID number 601, a match count 602, an exemplar features part 603, exemplar flags 604, threshold ranges 605 and various run pointers 606.

The exemplar ID number 601 is an index used by the symbol classifier to access the exemplar template.

The match count 602 is a storage location containing the number of symbols which match the exemplar.

The exemplar features part 603 contains the various exemplar features including width and height information, the number of 1's (black pixels) in the exemplar, the exemplar's slant, number of interior pixels, asymmetry as computed from horizontal runs, asymmetry as computed from vertical runs, the volume as computed from horizontal runs and the volume as computed from vertical runs ("volume" is the sum of the number of pixels enclosed between the far left and right endpoint on each scan line (top and bottom pixels in each scan column for vertical runs).

The exemplar flags 604 contains HVolume and VVolume flags used as a check for small dense symbols.

The threshold ranges part 605 contains the thresholds for comparing various symbol and exemplar features. Note that other threshold ranges are computed during the actual symbol classification processing.

The run pointers part 606 contains pointers to the lists of horizontal and vertical template groups used to check runs in an extracted symbol with the template and a pointer to runs defining the corresponding exemplar.

Equivalence Class Consolidation

After comparing all image symbols to exemplars, it is possible that there are too many equivalence classes. There are several possible causes. The first is lack of communitivity in comparison. Knowing symbol A does not match exemplar B does not tell us whether the symbol represented by exemplar B would match the exemplar for symbol A. If symbol B were found first and symbol A second, two exemplars may be created which really should be merged. Another cause of excess equivalence classes is misalignment. While an attempt to allow for misalignment along the axis of runs and match up the correct scan lines is made, it is not always successful.

The resulting class of merging equivalence classes is termed a consolidated equivalence class. Equivalence class consolidation takes into account at least four (4) cases:

1. Two isolated exemplars which are not members of a consolidated equivalence class are matched. In this case, a new consolidated equivalence class is created.
2. An isolated exemplar matches an exemplar that is already a member of a consolidated equivalence class. In this case, the isolated exemplar is added to the existing consolidated equivalence class.
3. An exemplar that is already a member of a consolidated equivalence class matches an isolated exemplar. In this case, the isolated exemplar is added to the existing consolidated equivalence class.
4. Two exemplars which are already members of two different consolidated equivalence classes match. In this case, two existing consolidated equivalence classes are merged to create a new consolidated equivalence class comprised of the members of the two original consolidated equivalence classes.

In equivalence class consolidation, equivalence classes are merged by finding at least one member of one class that matches at least one member of another class. Since the matches are not exact, there is some trouble with transitivity. That is, symbol A matched symbol B and symbol B matched symbol C, but symbol A might not match symbol C. Extended far enough, there may be quite different symbols in the same class because there was some chain of inexact equivalencies.

In the currently preferred embodiment, transitivity problems are minimized by limiting the allowable size range of each merged class to be the intersection of the ranges of the merging classes. This guarantees that any symbol in one class would be close to any symbol in the other. With the size range bounded, the other tests are sufficiently accurate to prevent large differences. It should be noted that other tests may also be utilized to address such, such as providing allowable ranges of mass, but it has been determined that limiting to allowable ranges of size handles most cases.

Furthermore, when comparing individual symbols during class consolidation, the range of dimensions of symbols found in the first symbol's equivalence class are compared with the range allowed by the second symbol's class. If all symbols in the first class do not fit within the range specified in the second class, the two symbols cannot match. Likewise if all symbols in the second class do not fit within the range specified in the first class, the two symbols cannot match.

When consolidating equivalence classes, all the class exemplars are kept until it is decided which of them will become the exemplar of the new class. Classes are consolidated when any exemplar of one class matches any exemplar of another class. A feature of the classification process is that two symbols are not compared if they are already members of the same equivalence class.

Figure 7:
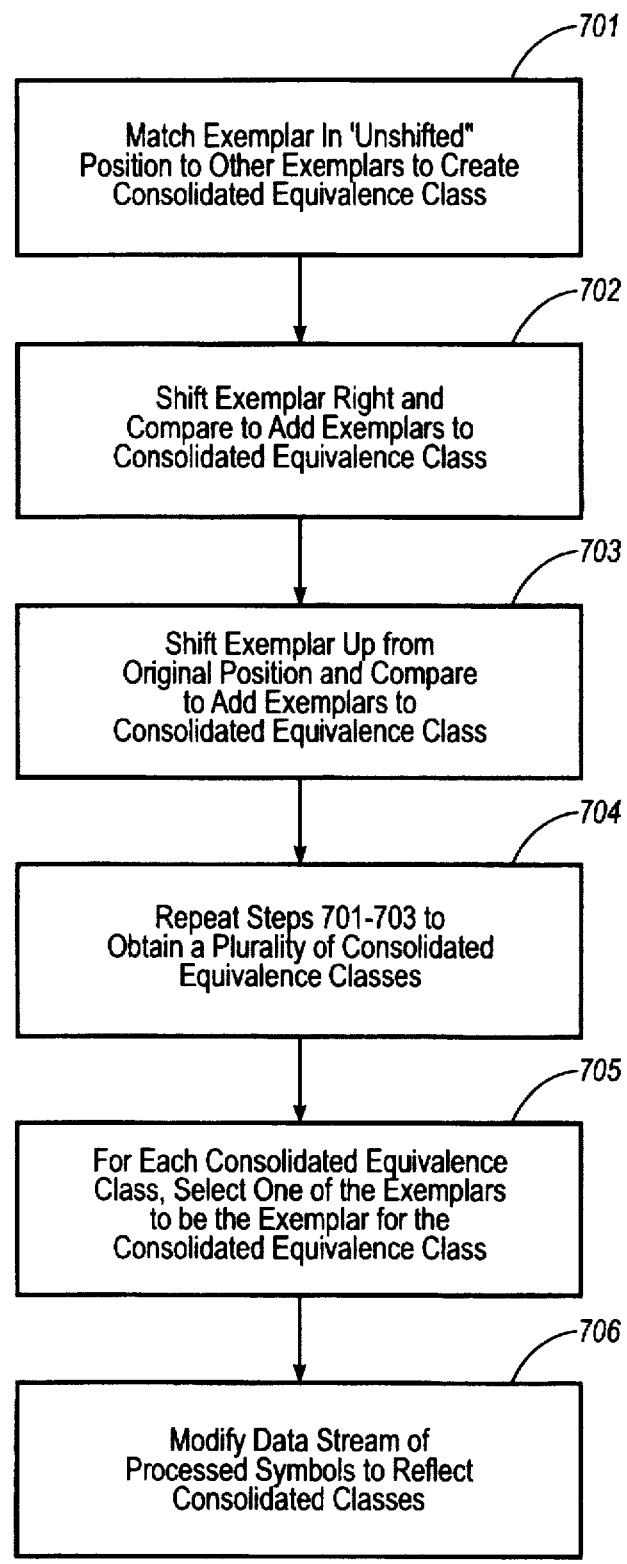
FIG. 7 is a flowchart outlining the basic steps for equivalence class consolidation as may be performed in the currently preferred embodiment of the present invention.
Figure 8:
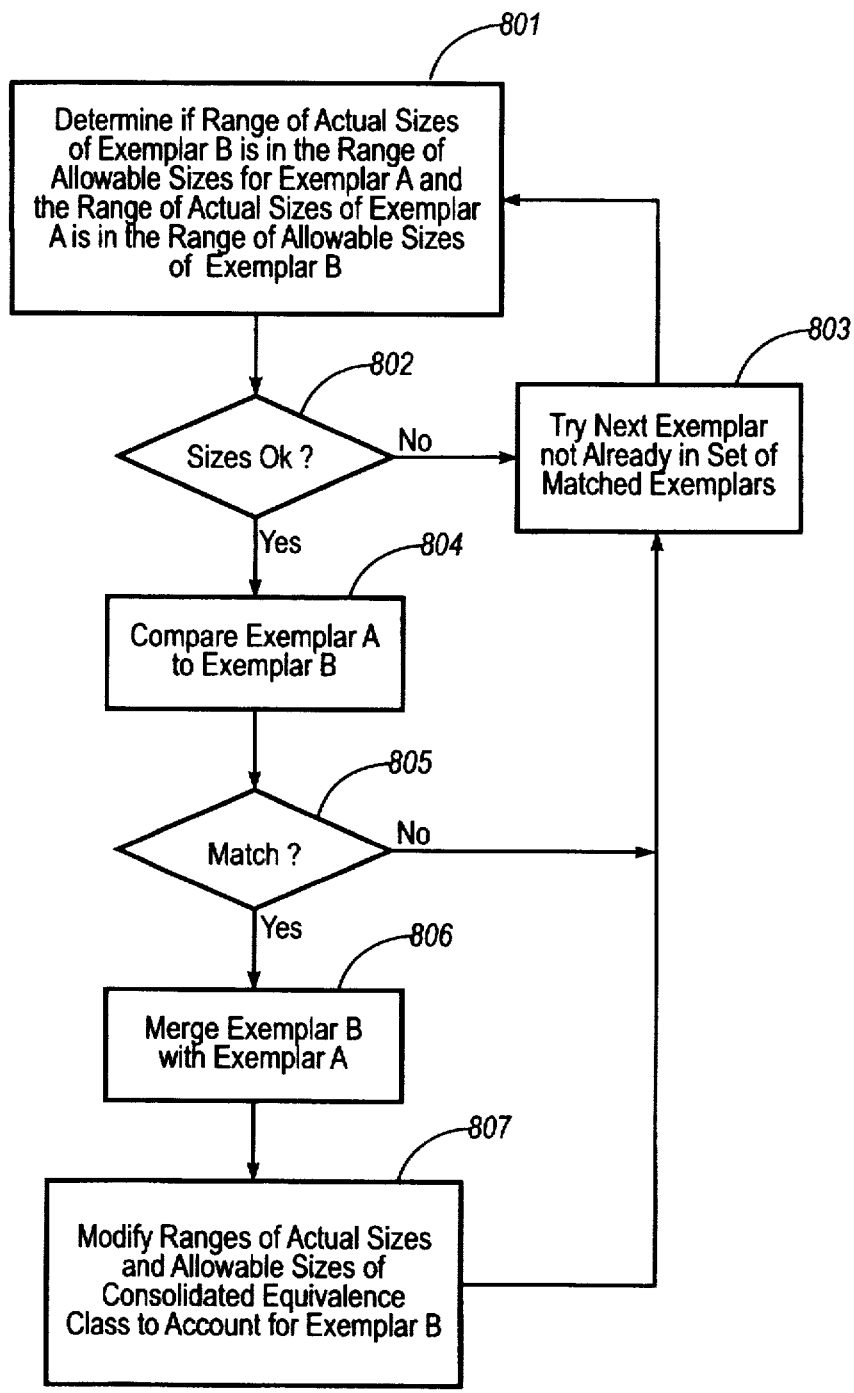
FIG. 8 is a flowchart outlining the substeps for the step of matching exemplars to create the consolidated equivalence classes described in FIG. 7.

FIGS. 7 and 8 describe the equivalence class consolidation of the currently preferred embodiment. FIG. 7 is a flowchart outlining the basic steps for equivalence class consolidation in the currently preferred embodiment of the present invention. Referring to FIG. 7, an exemplar is first matched with other exemplars in an "unshifted" position to create a consolidated equivalence class, step 701. Note that at this point, each exemplar is saved in the consolidated equivalence class. What is meant by "matched" is that the exemplars in the set have all matched at least one other exemplar in the set. The matching technique used is identical to that of the symbol classifier described above. As will be described below with reference to FIG. 8, the matching criteria becomes more stringent as more exemplars are matched. It should also be noted that each exemplar will belong to exactly one consolidated equivalence class.

In order to find the greatest number of matches, the exemplar is shifted. By "shifted" it is meant that the endpoints of all runs are modified. First, the exemplar is shifted right and matched to other exemplars, step 702 and then shifted up and compared to other exemplars, step 703. The exemplar is not matched to other exemplars in the same consolidated equivalence class. The steps 701–703 are repeated for all exemplars to obtain a plurality of sets of matched exemplars, step 704.

Once the exemplars are merged into consolidated equivalence classes, one of the exemplars is selected to be the exemplar for the consolidated equivalence class, step 705. In the currently preferred embodiment, this is determined by an accumulated match score. As described above, each equivalence class template carries with it a match count. This match count corresponds to the number of symbols that have been found to match the exemplar. During equivalence class consolidation when two exemplars are found to match, each exemplar inherits the match count of the other exemplar (i.e. the other exemplar's match count is added to their match count). The exemplar having the highest match count will become the exemplar to represent the equivalence class. Other techniques could be utilized, such as a weighted average of the match count, without departure from the spirit and scope of the present invention.

Finally, the data stream containing the processed symbols are modified to reflect the new consolidated equivalence classes, step 706. This can be accomplished by actually changing the exemplar ID's in the output data stream, or by providing a translation table that is used when the image is recreated. This will also involve providing the new consolidated equivalence classes as the dictionary.

FIG. 8 is a flowchart outlining the steps of matching exemplars that are performed in steps 701–703 of FIG. 7. For the purposes of describing this process, FIG. 8 refers to an Exemplar A and an Exemplar B. Exemplar A is the exemplar which is being compared to the other exemplars. Exemplar B represents an instance of an exemplar that is being compared to Exemplar A. Both Exemplar A and Exemplar B may be an isolated exemplar or be an exemplar that is part of a consolidated equivalence class. In the former instance, the recited values/ranges in FIG. 8 refer to values/ranges for that exemplar. In the latter instance, the recited values/ranges in FIG. 8 refer to values for the consolidated equivalence class. Further, each exemplar will have two specified size ranges, an Actual size range and an Allowed size range. The Actual size range represents the actual size or range of sizes for the exemplar or for the exemplars in consolidated equivalence class. The Allowed size range represents the allowed range of sizes which can match the exemplar.

Referring to FIG. 8, first it is determined if the Actual size range of Exemplar B is in the Allowed size range of Exemplar A AND the Actual size range of Exemplar A is in the Allowed size range of Exemplar, step 801. As described above, it has been determined that these size checks address transitivity concerns.

If "size OK", step 802 is no, the next exemplar not already in the same consolidated equivalence class is compared, step 803, and processing resumes at step 801. If "size OK", step 802 is yes, Exemplar A is compared to Exemplar B, step 804. The comparison steps are identical to those described above, with the exception that the symbol features need not be calculated since they are contained within the respective exemplar templates. If "Match?", step 805 is no, the next exemplar not already in the same consolidated equivalence class is compared, step 803, and processing resumes at step 801.

If "Match?", step 805 is yes, then Exemplar A is merged with Exemplar B, step 806. The merger will yield a consolidated equivalence class corresponding to the various combinations described above, namely a new consolidated equivalence class (Exemplar A and Exemplar B are both isolated Exemplars), merger of one of the Exemplars into an existing consolidated equivalence Class (either Exemplar A or Exemplar B is in an existing consolidated equivalence class) or the merger of two consolidated equivalence classes (Exemplar A and to Exemplar B are both members of existing consolidated equivalence classes).

Next, the Actual size rang(e and the Allowed size range for the consolidated equivalence class are modified to account for Exemplar B (or the consolidated equivalence class in which Exemplar B used to belong), step 807. As a result, the two sizes ranges are modified such that: 1) the Actual size in the class typically gets larger because of the additional exemplars; and 2) the Allowed size range to match the new class typically gets smaller because this range is the intersection of the range of allowed for the two merged classes.

Example

Equivalence class consolidation is further described with respect to the foregoing example. Assume that we have the following eight (8) equivalence class exemplars:

A B C D E F G H

First the equivalence class A is compared to all the other equivalence classes of similar size. Assume equivalence class A matches with equivalence classes B, E and G to yield:

(A, B, E, G) C D F H

So now there are only five (5) sets of equivalence classes represented and (A, B, E, G) is a consolidated equivalence class. The comparison is repeated for each exemplar, namely equivalence classes B-H are all compared to the others, with the exception that exemplars in the same set are not compared. Assume that it is determined that equivalence classes C and F match and equivalence classes D and H do not match any other equivalence class. This yields:

(A, B, E, G)(C, F) D H

So now there are only four equivalence classes with (C, F) also being a consolidated equivalence class. For the consolidated equivalence classes, it remains to select the exemplar to represent the class. Here, the one with the most cumulative symbol matches will be the representative. So for example if A had 50 matches, B 40 matches, E 46 matches and G 20 matches, exemplar A would represent that class.

Figure 9:
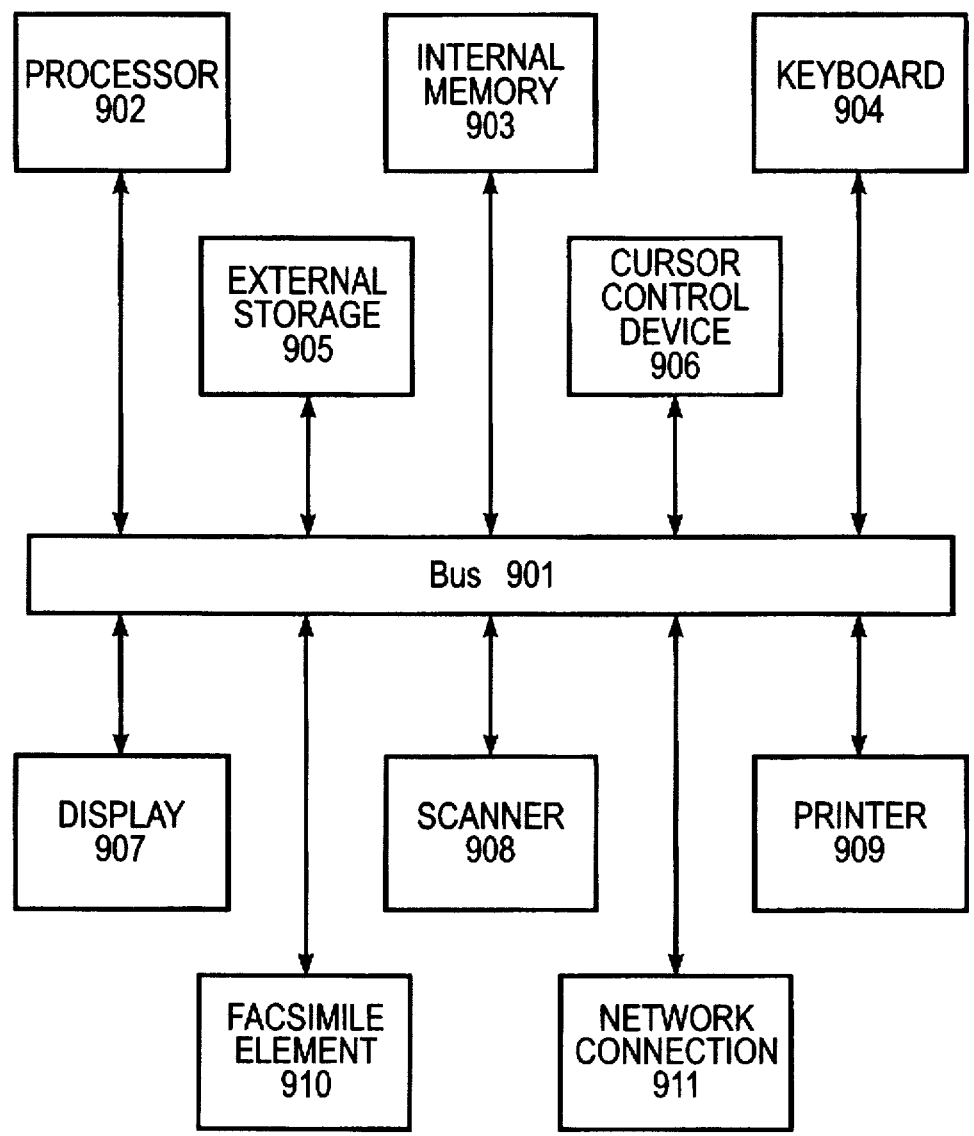
FIG. 9 is a block diagram of a computer based system in which the currently preferred embodiment of the present invention may be utilized.

Overview of a Computer Based System In the Currently Preferred Embodiment of the Present Invention The computer based system on which the currently preferred embodiment of the present invention may be used is described with reference to FIG. 9. Referring to FIG. 9, the computer based system is comprised of a plurality of components coupled via a bus 901. The bus 901 illustrated here is simplified in order not to obscure the present invention. The bus 901 may consist of a plurality of parallel buses (e.g. address, data and status buses) as well as a hierarchy of buses (e.g. a processor bus, a local bus and an I/O bus). In any event, the computer system is further comprised of a processor 902 for executing instructions provided via bus 901 from Internal memory 903 (note that the Internal memory 903 is typically a combination of Random Access or Read Only Memories). Such instructions are those that are preferably implemented in software for carrying out the processing steps outlined in the flowcharts of FIGS. 1-5 and 7-8. The processor 902 and Internal memory ROM 903 may be discrete components or a single integrated device such as an Application Specification Integrated Circuit (ASIC) chip.

Also coupled to the bus 901 are a keyboard 904 for entering alphanumeric input, external storage 905 for storing data, a cursor control device 906 for manipulating a cursor, and a display 907 for displaying visual output. The keyboard 904 would typically be a standard QWERTY keyboard but may also be telephone like keypad. The external storage 905 may be fixed or removable magnetic or optical disk drive. The cursor control device 906 will typically have a button or switch associated with it to which the performance of certain functions can be programmed. Further coupled to the bus 901 is a scanner 908. The scanner 908 provides a means for creating a bit-mapped representation of a medium (i.e. a scanned document image).

Optional elements that could be coupled to the bus 901 would include printer 909, facsimile element 910 and network connection 911. The printer 909 could be used to print the bit-mapped representation. The facsimile element 912 may contain an element used to transmit a image data that has been compressed using the present invention. Alternatively, the facsimile element 912 could include an element for decompression of a document image compressed using the present invention. The network connection 911 would be used to receive and/or transmit data containing image data. Thus, the image data utilized by the present invention may be obtained through a scanning process, via a received fax or over a network.

Thus, a method and apparatus for classification of scanned symbols into equivalence classes is disclosed. While the present invention is described with respect to a preferred embodiment, it would be apparent to one skilled in the art to practice the present invention with other alternative embodiments. Such alternate embodiments would not cause departure from the spirit and scope of the present invention.

I claim:

1. A method for classifying symbols contained in binary encoded image data comprising the steps of:
   a) extracting a run-length encoded representation of a symbol;
   b) determining symbol features of said extracted symbol from said run-length encoded representation;
   c) selecting a set of equivalence classes to which said extracted symbol may be compared from a dictionary, said dictionary comprised of equivalence classes created from previously extracted symbols, each equivalence class having a template, said template comprising information for matching an exemplar representing said equivalence class;
   d) comparing said extracted symbol with the exemplars for each of said set of equivalence classes using said associated templates until a match is found or all exemplars have been compared with no match, said comparing step comprising the substeps of:
      d1) determining if a first set of symbol features are within corresponding threshold ranges specified in the template of the exemplar being compared to;
      d2) if any of said first set of symbol features are not within said threshold ranges, indicating that the extracted symbol does not match the exemplar being compared to;
      d3) if all the said first set of symbol features are within said threshold ranges, determining if run endpoints extracted symbol satisfy run endpoint ranges specified in the template of the exemplar being compared to;
   e) if said comparison step d) yields a match, indicating said extracted symbol is in the equivalence class of the exemplar being compared;

f) if said comparison step d) does not yield a match, creating a new equivalence class with said extracted symbol as the exemplar; and g) adding said new equivalence class to said dictionary.

2. The method as recited in claim 1 wherein said step of selecting a set of equivalence classes to which said extracted symbol may be compared from a dictionary further comprises the steps of:

d1) determining an extracted symbol size for said extracted symbol; and d2) selecting equivalence classes having a size within a predetermined tolerance of said extracted symbol size.

3. The method as recited in claim 1 wherein prior to said substep d3) performing the substeps of:

determining if said extracted symbol is small;

if said extracted symbol is small, determining if a second set of symbol features are within corresponding threshold ranges specified in the template of the exemplar being compared to; and if any of said second set of symbol features are not within said threshold ranges, indicating that the extracted symbol does not match the exemplar being compared to.

4. The method as recited in claim 3 wherein said substep of determining a set of symbol features for said extracted symbol is further comprised of the steps of:

determining a mass value for said extracted symbol, said mass value corresponding to the number of black pixels in said extracted symbol;

determining an interior value for said extracted symbol, said interior value corresponding to the number of black pixels minus the number of horizontal edge pixels;

determining a slant value, said slant value corresponding to a measure of tilt of said extracted symbol;

determining a horizontal volume value, said horizontal volume value corresponding to the number of pixels contained in runs extending at least a predetermined width of said extracted symbol; and determining a vertical volume value, said vertical volume value corresponding to the number of pixels contained in runs extending at least a predetermined height of said extracted symbol.

5. The method as recited in claim 4 wherein said first set of symbol features is comprised of symbol height, symbol width and symbol slant.

6. The method as recited in claim 5 wherein said second set of symbol features is comprised of symbol mass, symbol interior, symbol horizontal volume and symbol vertical volume.

7. The method as recited in claim 1 further comprising the step of generating vertical runs from said horizontal runs of said extracted symbol and wherein said substep of comparing run endpoints of runs in said extracted symbol with run endpoints of runs in said exemplar to determine if a match exists is performed for both horizontal and vertical runs.

8. The method as recited in claim 7 wherein prior to said step of comparing said extracted symbol with the exemplars for each of said set of equivalence classes using said associated templates performing the step of aligning the extracted symbol with the exemplar template.

9. The method as recited in claim 8 wherein said step of aligning the extracted symbol with the exemplar template is further comprised of the steps of:

changing the coordinates of the symbol runs to minimize the effect of dimensional changes caused by noise;

generating an alignment row from a bottom row of said extracted symbol;

generating an alignment column from a left most column of said extracted symbol;

when comparing horizontal runs, determining if an alignment row is needed by comparing one of 1) distance from horizontal axis to bottom row of extracted symbol and distance from horizontal axis to bottom row of exemplar being compared to or 2) distance from horizontal axis to top row of extracted symbol and distance from horizontal axis to top row of exemplar being compared to; and when comparing vertical runs, determining if an alignment column is needed by comparing one of 1) distance from vertical axis to left most column of extracted symbol and distance from vertical axis to left most column of exemplar being compared to or 2) distance from vertical axis to right most column of extracted symbol and distance from vertical axis to right most column of exemplar being compared to.

10. The method as recited in claim 9 wherein said substep of changing the coordinates of the symbol runs to minimize the effect of dimensional changes Caused by noise is further comprised of the steps of:

changing the coordinates so that they are relative to the center of the extracted symbol; and increasing the coordinate points by a predetermined factor.

11. A method for compressing image data comprising the steps of:

a) extracting a run-length encoded representation of a symbol from said image data;

b) determining symbol features of said extracted symbol from said run-length encoded representation;

c) selecting a set of equivalence classes to which said extracted symbol may be compared from a dictionary, said dictionary comprised of equivalence classes created from previously extracted symbols, each equivalence class having a template, said template comprising information for matching an exemplar representing said equivalence class;

d) comparing said extracted symbol with the exemplars for each of said set of equivalence classes using said associated templates until a match is found or all exemplars have been compared with no match, said comparing step comprising the substeps of:

d1) determining if a first set of symbol features are within corresponding threshold ranges specified in the template of the exemplar being compared to;

d2) if any of said first set of symbol features are not within said threshold ranges, indicating that the extracted symbol does not match the exemplar being compared to;

d3) if all the said first set of symbol features are within said threshold ranges, determining if run endpoints in said extracted symbol satisfy run endpoint ranges specified in the template of the exemplar being compared to;

e) if said comparison step d) yields a match encoding said extracted symbol by an exemplar identifier for the exemplar being compared to and position information of the extracted symbol;

f) if said comparison step d) does not yield a match, performing the substeps of:

f1) creating a new equivalence class with said extracted symbol as the exemplar;

f2) adding said new equivalence class to said dictionary; and f3) encoding said extracted symbol by an exemplar identifier for the exemplar in the new equivalence class and position information of the extracted symbol; and g) repeating steps a)–f) until all symbols have been extracted from said image data.

12. A system for classifying symbols contained in binary encoded image data comprising:

input means for receiving binary encoded image data;

symbol extraction means for extracting symbols from said binary encoded image data in a run format;

classification preparation means generating extracted symbol features for an extracted symbol from said run format;

dictionary means for generating and maintaining a dictionary of equivalence classes for classifying extracted symbols, each of said equivalence classes represented by an exemplar template, said exemplar template comprising information for matching an exemplar representing said equivalence class, said information comprising a first set of criteria for checking all symbols;

comparison means coupled to said dictionary means, said comparison means for comparing symbol features and symbol runs with an exemplar template to determine if a match exists;

wherein said comparison means determines if the symbol run endpoints satisfy run endpoint ranges specified in the exemplar template being compared to.

13. The system as recited in claim 12 wherein said run format is a list of horizontal runs and said system further comprises means for generating vertical runs for said extracted symbol from said list of horizontal runs.

14. The system as recited in claim 13 wherein said classification preparation means is further comprised of alignment preparation means for changing run coordinates to be relative to the center of said extracted symbol and further for creating an alignment row and an alignment column.

15. The system as recited in claim 14 wherein said comparison means is further comprised of means for determining if said extracted symbol needs row alignment prior to checking of horizontal runs or if said extracted symbol needs column alignment prior to checking vertical runs.

16. The system as recited in claim 15 wherein said comparison means is further comprised of means for determining if said exemplar template needs row alignment prior to checking of horizontal runs or if said exemplar template needs column alignment prior to checking vertical runs.

17. The system as recited in claim 16 wherein said dictionary means is further comprised of template generation means comprised of means for generating template groups for defining match criteria for horizontal and vertical runs.

18. The system as recited in claim 17 wherein said comparison means is further comprised of means for identifying if runs in a run list match corresponding template group criteria.

19. The system recited in claim 18 wherein said template generation means is further comprised of means for generating symbol feature thresholds to which extracted symbol features must comply in order for a match to occur.

20. The system as recited in claim 19 wherein said extracted symbol features is comprised of symbol height, symbol width, symbol slant, symbol mass, symbol interior, symbol vertical volume and symbol horizontal volume.

21. The system as recited in claim 20 wherein said first set of criteria is comprised of a symbol height threshold, a symbol width threshold, a symbol slant threshold, said horizontal template groups and said vertical template groups.

22. The system as recited in claim 21 further comprising a second set of criteria for checking small symbols.

23. The system as recited in claim 12 further comprising output means for outputting an output stream comprised of exemplar identifiers with corresponding positional information and said dictionary.

24. The system as recited in claim 22 wherein said second set of criteria is comprised of a symbol mass threshold, symbol interior threshold, symbol vertical volume threshold and symbol horizontal volume threshold.

25. The method as recited in claim 1 wherein said step d3) determines the run endpoint ranges are satisfied by examining whether endpoint positions of the runs in said extracted symbol are within corresponding ranges of legal endpoint locations.

* * * * *